United States Patent [19]

Murray

[11] Patent Number: 4,896,058
[45] Date of Patent: Jan. 23, 1990

[54] TTL CIRCUIT HAVING RAMPED CURRENT OUTPUT

[75] Inventor: Robert J. Murray, Mapleton, Utah

[73] Assignee: North American Philips Corp., New York, N.Y.

[21] Appl. No.: 186,502

[22] Filed: Apr. 26, 1988

[51] Int. Cl.⁴ .................. H03K 19/088; H03K 17/16; H03K 19/092
[52] U.S. Cl. .................................. 307/456; 307/443; 307/454; 307/475; 307/517
[58] Field of Search ............... 307/443, 454, 456, 475, 307/517

[56] References Cited

U.S. PATENT DOCUMENTS 4,745,308  5/1988  Neely ................................. 307/443

FOREIGN PATENT DOCUMENTS 60-10133  7/1986  Japan .

OTHER PUBLICATIONS

IBM, Tech. Disc. Bul., vol. 27, No. 1A, Jun. 1984, Stoops.

Primary Examiner—Stanley D. Miller
Assistant Examiner—M. R. Wambach
Attorney, Agent, or Firm—Steven R. Biren

[57] ABSTRACT

In conventional logic buffer circuits, internal signal overshoot during switching transitions causes power supply spikes or bounce, which may in turn degrade the operational reliability of other circuits in the same system. By using a pair of current amplifier circuits within the logic buffer circuit to shunt a portion of the signal overshoot, the output current of the logic buffer circuit is caused to change linearly with time, so that power supply bounce or spikes are substantially reduced.

5 Claims, 1 Drawing Sheet

TTL CIRCUIT HAVING RAMPED CURRENT OUTPUT

BACKGROUND OF THE INVENTION

This invention relates generally to logic circuits, and more specifically to a type of transistor-transistor logic (TTL) buffer circuit having improved performance during output voltage transitions.

It has been recognized that TTL components are generally susceptible to power supply spikes or "bounce" during transitions in output voltage from one state to another. This problem is most detrimental when all of the TTL outputs make the same transition (i.e. from low to high, or from high to low). These power-supply spikes result from the relatively rapid rate of change of the current flowing through the inherent inductance in the power supply conductors within an IC package. As TTL integrated circuits have become faster, output transition times have decreased and this has resulted in increased power supply bounce due to the rapid turn-on of the output transistors.

Previous attempts to control power supply bounce have focussed on the technique of obtaining a controlled voltage ramp at the TTL circuit output. This approach is less than optimum in achieving the desired result, however, since the output current is proportional to the rate of change of the output voltage, and thus still changes very rapidly from zero to a finite value. The result is a large transient rate of change of current, and thus a substantial power supply bounce.

One example of a prior-art circuit in which power-supply bounce is partially controlled by providing a controlled voltage ramp at the output is shown in commonly-owned U.S. patent application Ser. No. 134,494, incorporated herein by reference. A background discussion of the power-supply bounce problem and earlier prior-art attempts to minimize this problem are detailed in that application. Another prior art circuit, employing MOS transistors in a configuration which partially controls power-supply bounce using a control signal with a square-root characteristic, is shown in European Patent Application No. EP-A-0 250 036.

An example of a substantially different circuit for controlling the rate of change of an output current in an FET circuit is shown in "IBM Technical Disclosure Bulletin", Vol. 27, No. 1A, June, 1984, at pages 13-14, while a logic circuit incorporating transistors in a Darlington configuration for lowering the base potential of a transistor to limit changes in the transition time of an output voltage is shown in Japanese Kokai No. 61-170127.

Ideally, it would be desirable to have the output current (rather than voltage) increase linearly with time so that the power supply bounce stays at a relatively low and constant level during the transition. This would result in a parabolic voltage output waveform during the major portion of the transition period. Additionally, it would be desirable to reduce the power supply bounce without greatly increasing the propagation delay time or affecting the steady-state operation of the circuit.

SUMMARY OF THE INVENTION

It is therefore an object of the invention to provide a logic buffer circuit which minimizes power supply spikes or bounce during output voltage level transitions.

It is a further object of the invention to provide this reduction in power supply bounce without greatly increasing the propagation delay time or affecting the steady-state operation of the circuit.

In accordance with the invention, these objects are achieved by a new logic buffer circuit which includes a control circuit, an output pull-up driver circuit and an output pull-down driver circuit in accordance with known technology. The improvement of the invention is provided by additional circuitry for generating a ramped current output for both high-to-low and low-to-high output level transitions. This circuitry includes a first current amplifier circuit coupled between the control circuit and a source of reference voltage such as ground, and a second current amplifier coupled between the control circuit and the output terminal of the logic buffer circuit.

The purpose of these current amplifiers is to control the overshoot of the base-emitter voltage of the appropriate transistor in whichever output driver circuit is operational during a given output state change. By controlling this voltage overshoot, the internal power supply bounce produced by rapidly increasing output currents is limited, thus permitting more reliable circuit and system operation.

Two current amplifier circuits are used in the invention so that both the high-to-low and the low-to-high transitions are controlled. One of the current amplifier circuits is active during the low-to-high transition, while the other current amplifier circuit is active during the high-to-low transition, with both circuits being quiescent during the steady state so as not to increase current consumption or alter output level.

The invention may be more completely understood with reference to the following detailed description, to be read in conjunction with the accompanying drawing.

DESCRIPTION OF THE PREFERRED EMBODIMENTS

Figure 1:
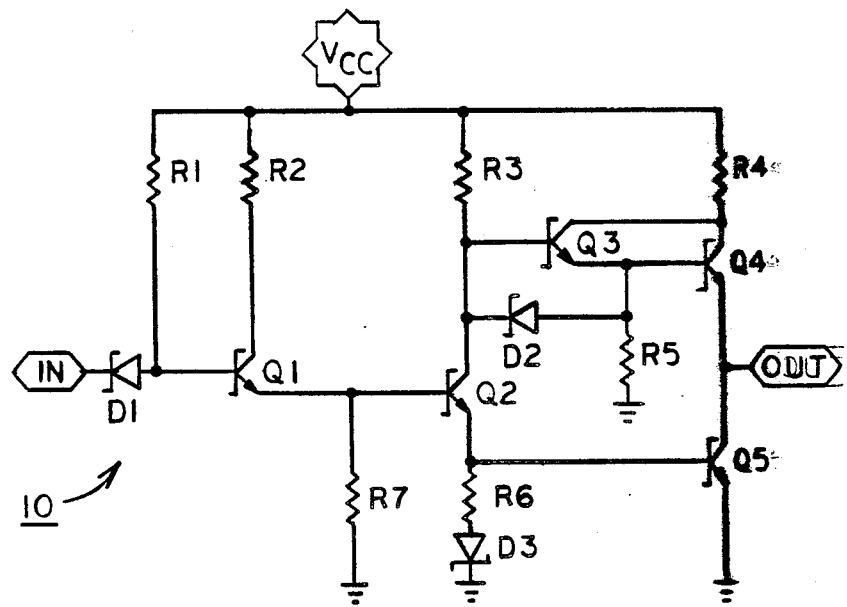
FIG. 1 shows a schematic circuit diagram of a prior-art logic buffer circuit.

A schematic circuit diagram of a prior-art logic buffer circuit 10 is shown in FIG. 1. This circuit includes a control circuit composed of a diode D1 connected to an input terminal IN, transistors Q1 and Q2, and associated passive components. The control circuit is coupled at the collector of transistor Q2 to an output pull-up driver circuit having transistors Q3 and Q4 connected in a Darlington configuration, while the emitter of transistor Q2 is coupled to the base of transistor Q5, which is the active component of an output pull-down circuit. The emitter of transistor Q4 is connected to the collector of transistor Q5, and this common connection point forms the output terminal OUT of logic buffer circuit 10. As noted above, circuits of this general type are well-known in the art, and will therefore not be described in further detail here.

One problem associated with prior-art circuits such as that shown in FIG. 1 is the presence of large power supply spikes or bounce during output transitions. These large power supply spikes result from the rapid turn-on of the output transistors, which in turn is caused by an increase in current supplied to the base of the output transistor which is switching on, thus resulting in large surge currents in the output and large power-supply spikes. Such large spikes are clearly undesirable as they may interfere with the reliable operation of associated logic circuitry connected to the same power-supply bus.

In operation, a signal applied to the input terminal IN is coupled through diode D1 and transistors Q1 and Q2 to the output driver circuits. For the low-to-high output level transition, a positive-going signal is applied from the collector of transistor Q2 to the base of transistor Q3 of the Darlington amplifier Q3, Q4. This positive-going signal causes transistors Q3 and Q4 to turn on, resulting in a low-to-high transition at the output terminal OUT. For the high-to-low transition, a positive-going signal is transferred from the emitter of transistor Q2 to the base of transistor Q5, thus turning transistor Q5 on and causing a high-to-low transition at the out terminal OUT. When transistor Q5 is on, transistor Q4 is off, and vice versa.

The problem with this prior-art circuit is that the turn-on signals appearing at the bases of transistors Q3 and Q5 during the switching transitions have overshoots which cause input currents to these transistors in excess of the quiescent values, thus resulting in large surge currents in the output circuit. These surge currents also flow through the inherent inductance in the power supply leads, thus creating power supply spikes or bounce. Since the voltage appearing across an inductance is proportional to the time rate of change of current through the inductor, the rapid switching times in modern integrated circuits result in increased power supply spikes, which in turn result in unreliable operation of associated TTL circuitry using the same supply line.

Previous attempts to control the power supply bounce or spike problem have adopted the approach of generating a controlled voltage ramp at the circuit output. However, this solution is not completely effective since output current is proportional to the time rate of change of the output voltage, and thus the output current still changes very rapidly from 0 to a finite value, resulting in a large instantaneous time rate of change in current and a substantial power supply spike. Accordingly, a more ideal solution to the problem would be to provide a circuit in which the output current increases linearly with time, so that the power supply bounce stays at a relatively low and constant level during the transition. This results in a parabolic voltage output waveform during the majority of the transition. Ideally, such an output waveform should be generated while minimizing any increase in the propagation delay time, and without affecting the steady-state operation of the circuit.

Figure 2:
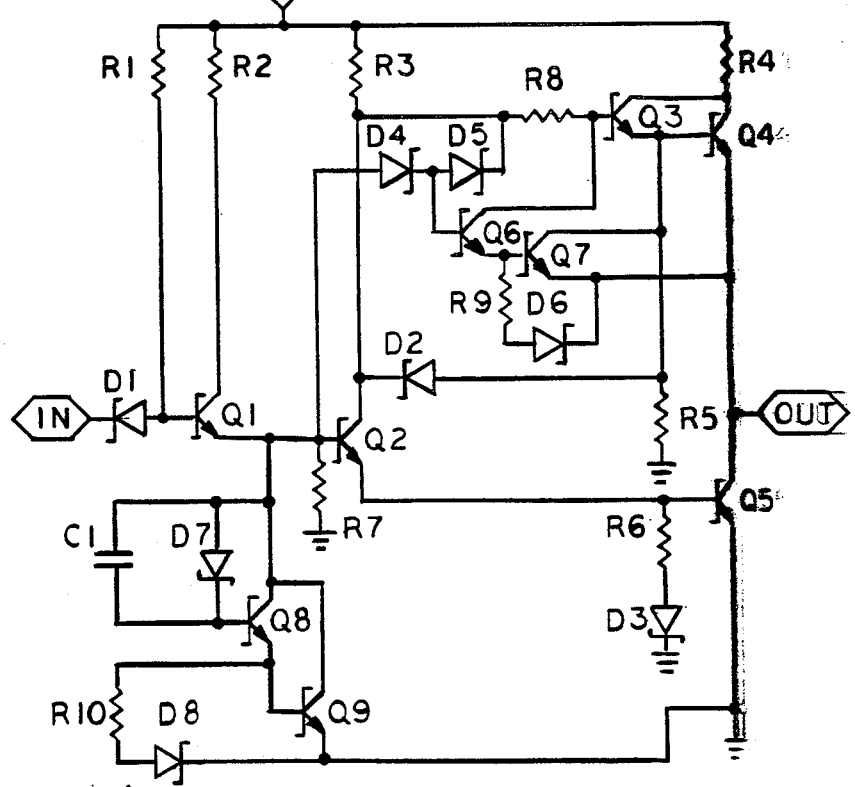
FIG. 2 shows a schematic circuit diagram of a logic buffer circuit in accordance with the invention.

In order to accomplish these objects, an improved logic buffer circuit in accordance with the invention is provided with additional circuitry in order to achieve the desired reduction in power supply bounce. In FIG. 2, an improved logic buffer circuit 20 has the same basic control circuit and output pull-up and pull-down driver circuits as in FIG. 1, and the components of these portions of the circuit are designated with like reference numerals for clarity.

The principal components of the invention include two current amplifier circuits composed of transistors Q6 and Q7, and Q8 and Q9, respectively. The purpose of these current amplifiers is to shunt off a portion of the increased current that would otherwise be supplied to the bases of transistors Q2 and Q3 due to the overshoot in base input voltage to these transistors during the switching transitions. An additional advantage of the circuit configuration of the invention is that these current amplifier circuits are operational only during the switching transition periods, and are quiescent at other times, thus not affecting the DC performance of the circuit.

The additional circuitry of the invention includes two current amplifiers connected to the remaining circuitry in such a manner as to shunt excess current away from the output pull-up and pull-down driver circuits, thereby reducing the initial overshoot at the input to these driver circuits, which in turn substantially reduces he power supply bounce problem. More specifically, a first current amplifier includes with the collector of transistor Q8 connected to the junction between the emitter of Q1 and the base of Q2 of the control circuit, and the base of transistor Q8 coupled to that same junction by either a diode D7, or a diode D7 in parallel with a capacitor C1 as shown in FIG. 2. The emitter of transistor Q9 of this current amplifier is connected to ground, so that current generated from any overshoot at the base of transistor Q2 is thereby shunted to ground. The degree of signal shunting obtained by this current amplifier may be "fined tuned" if desired by the addition of a series-connected resistor R10 and diode D8 connected between the base of transistor Q9 and ground.

Similarly, a second current amplifier includes transistors Q6 and Q7, with the base of transistor Q6 being coupled to the base of transistor Q2 through a diode D4, and to the collector of transistor Q4 through diode D5. Alternatively, a capacitor may be used to couple the collector of transistor Q2 to the base of transistor Q6. The collector of transistor Q6 is connected directly to the base of Q3, and may be connected either directly or through a resistor R8 as shown in FIG. 2 to the collector of transistor Q2. The current output of transistor Q6, at its emitter, is connected to the base of Q7, while the collector of Q7 is connected to the emitter of Q3 and the emitter of Q7 is connected to the emitter of transistor Q4 at the output terminal OUT. As in the case of the first current amplifier, described above, a resistor R9 and a diode D6 may optionally be connected in series between the emitter of transistor Q6 and the emitter of transistor Q7 for more precise control of the current-shunting function.

The two current amplifier circuits described above operate in similar manner, and will accordingly be described together in the interest of brevity. The principal operational difference between the two current amplifier circuits is that the circuit containing Q6 and Q7 is operational during the low-to-high output level transition, while the circuit containing transistors Q8 and Q9 is active during the high-to-low output level transition. For both current amplifier circuits, before the transition, the base of the input transistor of the current amplifier (Q6 or Q8) is held at an appropriate bias voltage by a diode (D4 or D7) connected to the emitter of transistor Q1. As the voltage rises at the base of the transistor (Q3 or Q2) which drives the output transistor (Q4 or Q5), charge is coupled to the base of the first transistor of the respective current amplifier circuit (Q6 or Q8) by coupling components such as diode D5, diode D7 and capacitor C1. This charge is multiplied by the gain factor of the first transistor (Q6 or Q8) and then is coupled to the respective second transistor of the current amplifier circuit (Q7 or Q9) for additional amplification.

For the first current amplifier circuit, surge currents are shunted from the base of transistor Q2 through transistors Q8 and Q9 to ground. For the second current amplifier circuit, surge currents at both the base of transistor Q3 and transistor Q4 are shunted through the collectors of Q6 and Q7, respectively, to the output terminal OUT. For both current amplifier circuits, the net effect is to substantially reduce the signal overshoot at the base of the transistor to which the current amplifier is connected, and thereby cause the output current of the logic buffer circuit to more linearly ramp during output level transitions, thereby substantially reducing power supply spikes or bounce. During steady-state operation, between transition periods, both current amplifier circuits are inactive and have no effect on the DC performance of the circuit. Additionally, the current amplifier circuits of the invention reduce power supply spikes or bounce while minimizing the increase in propagation delay within the circuit.

While the invention has been particularly shown and described with reference to several preferred embodiments thereof, it will be understood by those skilled in the art that various changes in form and detail may be made without departing from the spirit and scope of the invention.

I claim:

1. A logic buffer circuit having an input terminal and an output terminal, which comprises:
   control circuit means connected to said input terminal;
   output pull-up driver means coupled during operation to a supply voltage and having an input coupled to said control circuit means and an output coupled to said output terminal;
   output pull-down driver means coupled during operation to a reference voltage and having an input coupled to said control circuit means and an output coupled to said output terminal; and
   means for generating a ramped current output at said output terminal for both high-to-low and low-to-high output level transitions during operation and comprising a first current amplifier means coupled between said control circuit means and said reference voltage, and second current amplifier means coupled to said control circuit means and having an output connected to said output terminal.

2. A logic buffer circuit as claimed in claim 1, wherein said control circuit means comprises a first bipolar output transistor and said output pull-up driver means comprises a first Darlington amplifier having a bipolar input transistor and a second bipolar output transistor, said first current amplifier means receiving a control signal from the base of said first bipolar output transistor and being coupled between the base of said first bipolar output transistor and said reference voltage, and said second current amplifier means receiving a control signal from the collector of said first bipolar output transistor and being coupled between said Darlington amplifier and said output terminal, and said output pull-down driver means comprising a third bipolar output transistor having its base connected to the emitter of said first bipolar output transistor, its collector connected to said output terminal, and its emitter connected to said reference voltage.

3. A logic buffer circuit as claimed in claim 1, wherein said first and second current amplifier means operate only during output level transitions and are quiescent under steady-state conditions.

4. A logic buffer circuit as claimed in claim 2, wherein said first current amplifier means comprises a second Darlington amplifier having its common collector terminal coupled to said base of the first bipolar output transistor, its output emitter terminal connected to said reference voltage, and an emitter-base intermediate terminal, and a first diode connected between said base of the first bipolar output transistor and the base input terminal of said second Darlington amplifier, and said second current amplifier means comprises a second diode having a first terminal coupled to said base of the first bipolar output transistor and a second terminal, a third diode having a first terminal connected to said second terminal of the second diode at a common junction, such that said second and third diodes are connected in series with like polarity, and a second terminal, said second terminal being coupled to said base of the bipolar input transistor and the collector of said first bipolar output transistor, a third bipolar transistor having its base connected to said common junction and its collector connected to said base of the bipolar input transistor, and a fourth bipolar transistor having its base connected to the emitter of said third bipolar transistor, its collector connected to the emitter of said bipolar input transistor and its emitter connected to the emitter of said second bipolar output transistor.

5. A logic buffer circuit as claimed in claim 4, wherein said first current amplifier further comprises a first capacitor connected between the base input terminal and the common collector terminal of said second Darlington amplifier, and a series-connected first resistor and a fourth diode connected between said intermediate terminal and said emitter terminal of said second Darlington amplifier with said fourth diode having the same polarity as the base-emitter junctions of said second Darlington amplifier, and said second current amplifier further comprises a series-connected second resistor and fifth diode connected between the emitters of said third and fourth transistors with said fifth diode having the same polarity as the base-emitter junction of said fourth transistor, and a third resistor connected between said second terminal of said third diode and said base of the bipolar input transistor.

* * * * *